(12) United States Patent
Ma et al.

(10) Patent No.: US 7,057,454 B2
(45) Date of Patent: Jun. 6, 2006

(54) RESISTOR AND SWITCH-MINIMIZED VARIABLE ANALOG GAIN CIRCUIT

(75) Inventors: Fan Yang Ma, Singapore (SG); Wen Yu, Singapore (SG)

(73) Assignee: Infineon Technologies AG (DE)

( * ) Notice: Subject to any disclaimer, the term of this patent is extended or adjusted under 35 U.S.C. 154(b) by 28 days.

(21) Appl. No.: 10/855,861

(22) Filed: May 27, 2004

(65) Prior Publication Data

US 2005/0264360 A1    Dec. 1, 2005

(51) Int. Cl.
*H03F 1/36* (2006.01)

(52) U.S. Cl. .......................... 330/86; 330/282
(58) Field of Classification Search ................. 330/84, 330/254, 282, 86
See application file for complete search history.

(56) References Cited

U.S. PATENT DOCUMENTS

| 4,354,159 | A  | * | 10/1982 | Schorr et al. ................. 330/86 |
| 5,973,566 | A  | * | 10/1999 | Leiby .......................... 330/282 |
| 6,703,682 | B1 | * | 3/2004  | Aswell ......................... 257/536 |

* cited by examiner

*Primary Examiner*—Robert Pascal
*Assistant Examiner*—Hieu Nguyen
(74) *Attorney, Agent, or Firm*—Brinks Hofer Gilson & Lione

(57) ABSTRACT

A DSM variable high-gain circuit includes a differential amplifier and a negative feedback loop comprising low resistance poly resistors and switches configured in a T-structure having a junction point as part of the negative feedback loop. A third resistor branch of the T-structure includes a switch that connects the junction point through the third resistor branch to ground when in a closed state and that turns the third resistor branch into an open circuit when in an open state The switch of the third resistor branch, when in the closed state, produces a gain at the output of the variable high-gain circuit.

4 Claims, 9 Drawing Sheets

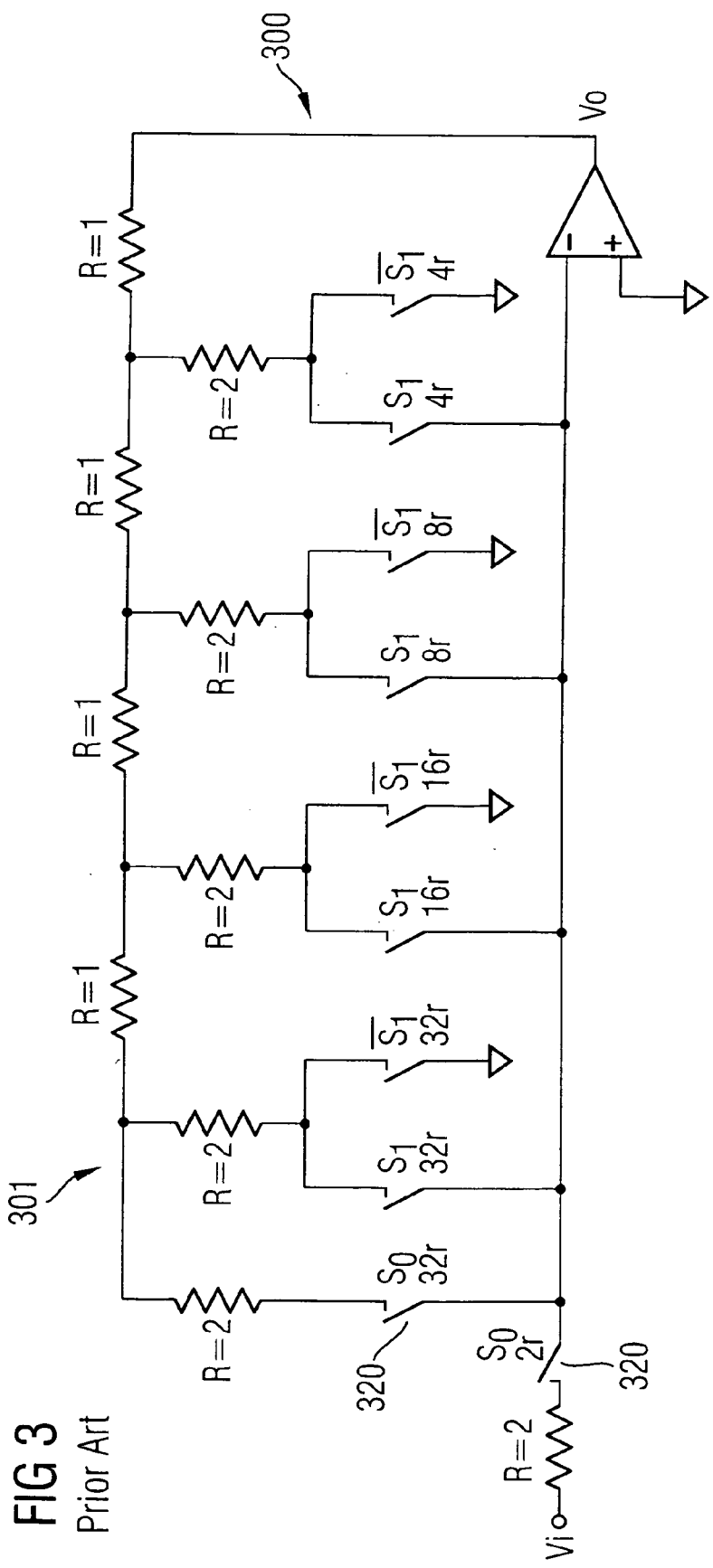

RESISTOR AND SWITCH-MINIMIZED VARIABLE ANALOG GAIN CIRCUIT

FIELD OF THE INVENTION

The present invention relates to gain circuits and in particular to gain circuits fabricated using deep sub-micron processes.

BACKGROUND OF THE INVENTION

Resistors with high resistance values are often used in the implementation of analog circuitry. Providing resistors with high resistance values was not a problem in earlier technologies as high sheet resistance resistors were available from the standard process flow. However, with the scaling down of critical dimensions in state of the art CMOS technologies high sheet resistance resistors are typically not available. For example, in a typical 0.18 micron technology, the poly resistors generated from a conventional process flow have a low sheet resistance ranging from 200 to 400 ohms per square. In order to obtain high sheet resistance resistors, additional process steps and mask levels are required. This is undesirable as it adds to the complexity and cost of fabricating the ICs.

As a result, in current advanced deep sub-micron (DSM) processes, analog designers either use low sheet resistance resistors to implement high value resistances or make do with smaller resistance values. The former approach, however, is not efficient for the miniaturisation as large resistors which consume more silicon space are required in order to implement high value resistances. FIG. 2 illustrates a traditional gain step circuit (see Grebene "Bipolar and MOS Analog Integrated Circuit Design", John Wiley, New York, 1984, FIG. 7.3, p. 313 and also see Gray et al., "Analysis and Design of Analog Integrated Circuits", $2^{nd}$ edition, John Wiley, 1984, FIG. 6.3, p. 354) wherein the gain of the circuit is given by:

$$\text{Gain} = \frac{V_0}{V_i} = 20\log_{10}\left(\frac{R_{202} + R_{203}}{R_{201}}\right)$$

Since the gain of the circuit is dependent on the ratio of the feedback resistors (R2 202 and R3 203) over input resistor R1 201, a large feedback resistor value is needed in order to obtain a high gain. For example, assuming that the values of the resistors in FIG. 2 are normalised and input resistor R1 201 has a resistance of unit value, the feedback resistor value will have to be 16 times larger in order to obtain a 24 dB gain. For the embodiment shown in FIG. 2, the large feedback resistance value is implemented by the large resistor R2 202 in combination with the smaller resistor R3 203. When using the circuit 200, the switch S0 is always closed. The large resistor R2 202 is selected by closing the switch S1 221 and opening the switch S2 222 in order to obtain the 24 dB gain. In order to obtain 0 dB gain, the switch S1 221 is open while the switch 222 is closed, thereby bypassing the large resistor R2 202. The resistor R3 203 is shared between both gain steps in order to reduce the total resistance value. The resulting large resistor area for resistor 202 not only consumes more silicon area, but also degrades analog matching performance, especially in high gain stages where the gain accuracy depends on the matching between big resistors (e.g. 202) and small resistors (e.g. 201 and 203). In such situations, the typical solution is to implement the small resistor using a parallel combination of large resistors. However, this not only increases the area further, but also leads to an increase in power consumption (if the resistor value is decreased to minimize the area increase) and possible degradation of the overall performance.

Another prior-art solution is to use the popular R-2R network 300 shown in FIG. 3 (see Grebene, FIG. 14.5, p. 759). For the example illustrated in FIG. 3, there are four branches 301. Each of the branches has a sub-branch connected to a virtual ground to produce a 6 dB gain variation for each branch. The four branches 301 are switched on or off together to produce a 0 or 24 db gain. Selective switching of the branches can be realized by a set or reset S1 control bit. Switches 320 are always turned on when the gain circuit is in use.

As evidenced from the above discussion, it would be desirable to have a resistor efficient gain circuit which reduces resistor area without adversely effecting the functionality of the circuit. Additionally, for some applications it is also important to have the gain circuit input impedance remaining constant so as not to change the external ac coupling network frequency response of the circuit and also avoid external input source loading effects.

SUMMARY OF THE INVENTION

The present invention relates generally to gain circuits. In particular, the present invention relates to the use of relatively low resistance resistors to implement high-gain circuits. Conventionally, a high-gain circuit is obtained by using a high resistance resistor in the negative feedback loop of a differential amplifier. In general terms, the present invention proposes replacing the high resistance feedback resistor with a T resistor network. The T resistor network comprising low resistance poly resistors and switches configured in a T-structure minimises the feedback resistance required.

The gain circuit of the present invention has a variable gain. It includes a differential amplifier, a negative feedback loop and a first T resistor network comprised of first, second and third resistor branches joined at a junction point. The first and second resistor branches are connected in series with the negative feedback loop. Additionally, the third resistor branch includes a switch that connects the junction point through the third resistor branch to ground when in a closed state and that turns the third resistor branch into an open circuit when in an open state. The switch of the third resistor branch, when in the closed state, produces a gain at the output of the variable analog gain circuit.

The benefit of resistor miniaturization by using relatively low value resistors is especially useful in technologies where resistors having high values are not easily implemented. For example, in DSM processes, high sheet resistance resistors are very costly. Additionally, the present invention also improves gain accuracy, scales parasitic switch impedance contributions, and provides a more constant gain circuit input impedance.

BRIEF DESCRIPTION OF THE DRAWINGS

The present invention will now be described, by way of example, with reference to the accompanying drawings, in which:

FIG. 3 provides an example of a prior-art gain step circuit using a R-2R network in the feedback loop.

FIG. 4 indicates the switch positions for achieving the desired gain output of FIG. 1.

DETAILED DESCRIPTION OF THE INVENTION

Figure 1:
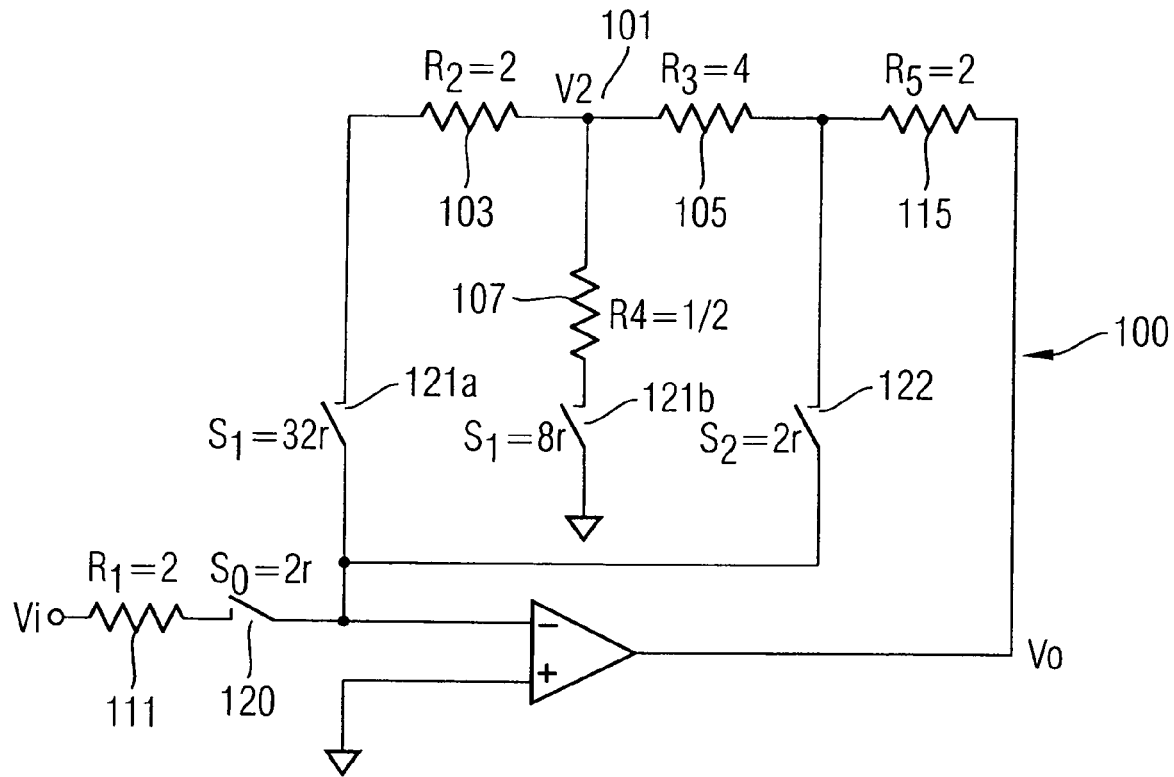
FIG. 1 is a schematic diagram of a 1-T gain circuit of the present invention.

FIG. 1 shows a gain step circuit 100 in accordance with one embodiment of the present invention. The resistor efficient gain step circuit reduces the resistor area without adversely affecting the functionality of the circuit. The present invention may also be applied to a normal gain circuit where there is no selection of gain. Although the gain step circuit illustrated in FIG. 1 supports both 0 dB and 24 dB gains, the present invention can also be applied to provide circuits with other gain values.

Generally, the present invention minimises the resistance of the resistors used by replacing the large resistors in a conventional gain circuit with a T resistor network. For example, the inventive gain circuit in FIG. 1 is derived by replacing the large resistor R2 202 in the conventional gain step circuit of FIG. 2 with a T resistor network 101 comprising three resistors R2 103, R3 105, R4 107. A T resistor network is made up of three branches wherein one end of each branch is connected to a common junction point. By choosing appropriate resistance values for the three resistors, a gain of 24 dB can be obtained. Referring to FIG. 1 where the values of the resistors indicated are normalised values, the total resistance value of the three resistors R2 103, R3 105, R4 107 is much less than that of the large resistor R2 202 in the conventional circuit of FIG. 2. Therefore the silicon area required for the resistors is greatly reduced, particularly for deep sub-micron circuits where the sheet resistances are low. Additionally, the gain circuit 100 of the present invention is also an improvement over the prior art R-2R circuit architecture of FIG. 3 which in comparison requires higher resistance and more switches.

In the step gain circuit shown in FIG. 1, the input resistor 111 is illustrated having a normalized constant value of 2 unit resistance. In order to select between 0 or 24 dB gain, switches S1 121a, b and S2 122 are controlled in a manner as shown in the table of FIG. 4. To provide a gain of 0 dB, switches S1 121a, b are open while switch 122 is closed. This selects resistor R5 115 as the feedback resistance and the output voltage magnitude, |Vo|=input voltage magnitude, |Vi| thereby giving a gain of 0 db (20 log 1=0 dB).

On the other hand, closing switches S1 121a and 121b while keeping switch 122 open provides a gain of 24 dB. Assuming that the voltage at the T junction is V2, and after algebraic deduction, the output voltage Vo can be expressed in terms of the input voltage Vi as (sign inversion is omitted):

$$V_0 = \frac{1}{R_1}\left(R2 + (R3 + R5) + \frac{(R3 + R5)R2}{R4}\right)Vi$$

Realisation of the 24 dB gain can be achieved by selecting R1 111=2 unit resistance, R2 103=2 unit resistance, R3 105=4 unit resistance, R4 107=½ unit resistance, R5 115=2 unit resistance as shown in FIG. 1. This results in VO=16Vi thereby giving a gain of exactly 24 dB. In a preferred embodiment, resistor 107 can be implemented by using two unit-value resistors in parallel thereby improving analog matching between the resistors. The total number of unit resistance in this case would be 12 which is more than a 50% reduction over the traditional gain circuit shown in FIG. 2 which uses 34 units of resistance. Additionally, there is also an improvement over the R-2R gain circuit of FIG. 3 which has a total number 16 unit resistance. Thus the present invention provides a reduction in resistance of 25% over the R-2R gain circuit. Resistor 115 is shared between both gain steps in order to reduce the total resistance value.

In one embodiment, the switches required in the gain circuit of the present invention are implemented using transistors. Preferably, they are implemented using MOS transistors because of their low current consumption when not switching. As the transistors are not ideal, there is a small turn-on resistance for each switch that is closed. Referring to FIG. 1, the annotations 2r, 32r etc. are used to denote the turn-on resistance of the switches. Although the turn-on resistance of the switches is generally much lower than the resistance of the resistors used in the gain circuit, it nevertheless has some impact on the accuracy of the gain step. In one embodiment, an always-on switch S0 120 is inserted in the input branch to compensate for this parasitic error. For applications having multiplexed inputs this switch S0 120 is the input multiplexing switch. The turn-on resistances of the other switches are scaled according to their relationship with the input switch S0 120 as shown in FIG. 1. With proper scaling of the turn-on resistances of the switches, the above equation is still valid.

In one embodiment, a switch may be physically made up of several switches connected in series or parallel in order to obtain the turn-on resistance required. For example, a MOS switch may be formed by connecting in series or parallel several MOS transistors having the same turn-on resistance. If the turn-on resistance of each unit MOS transistor is 2r (unit turn-on resistance), then switch S1 121b which has a turn-on resistance of 8r may be implemented by connecting 4 unit turn-on resistance transistors in series. Also, in a preferred embodiment, the switches are located near virtual ground to minimize voltage coefficient effects on switch matching. Virtual ground refers to, for example, the negative input port of an operational amplifier which for the circuit in FIG. 1 is the junction that connects switches S0 120, S1

121a and S2 122. Alternatively, a circuit's virtual ground can be some defined dc bias voltage near the middle of the supply voltage.

Figure 2:
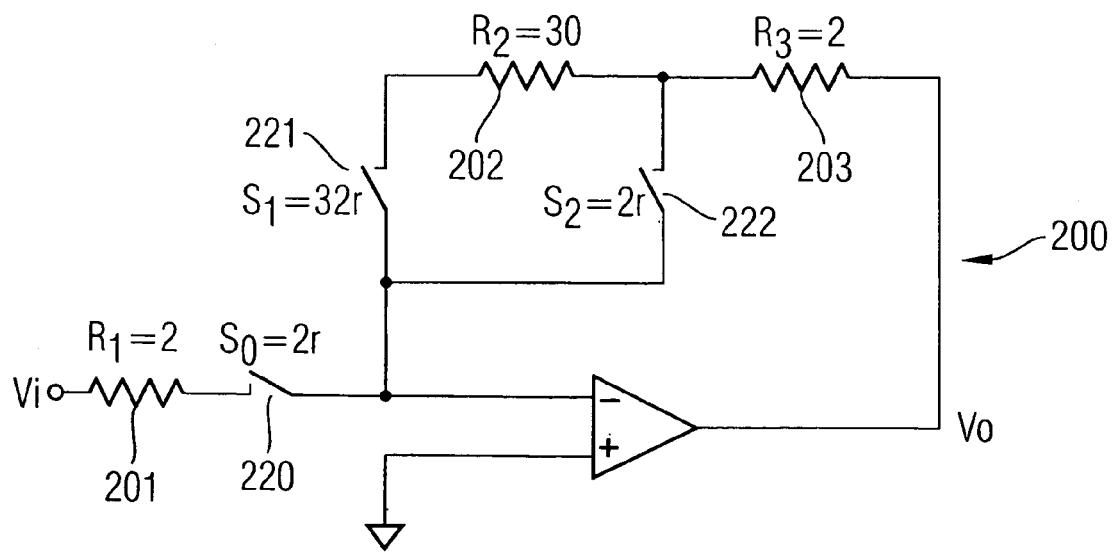
FIG. 2 shows a prior-art gain step circuit using low sheet value resistors in the feedback loop.

Assuming that the switches are implemented by connecting a number of unit switches each having a turn-on resistance of 2r, the gain circuit in FIG. 1 will require 22 switches as compared to only 18 switches in the prior-art circuit of FIG. 2. This is amounts to a 22% increase in the number of switches and hence the area occupied. However, in DSM applications, the switches that are transistors occupy a much smaller area as compared to the resistors. Thus, the increase in the number of switches is still worthwhile in view of the decrease in resistors that is required (12 unit resistors for the circuit of FIG. 1 versus 34 for the traditional circuit of FIG. 2).

The R-2R circuit of FIG. 3 requires 77 switches. Thus, the inventive circuit 100 of FIG. 1 reduces the required switches by about 70%. Thus, compared to the prior-art R-2R circuit, the present invention uses fewer resistors and switches and is more area-efficient.

Figure 5:
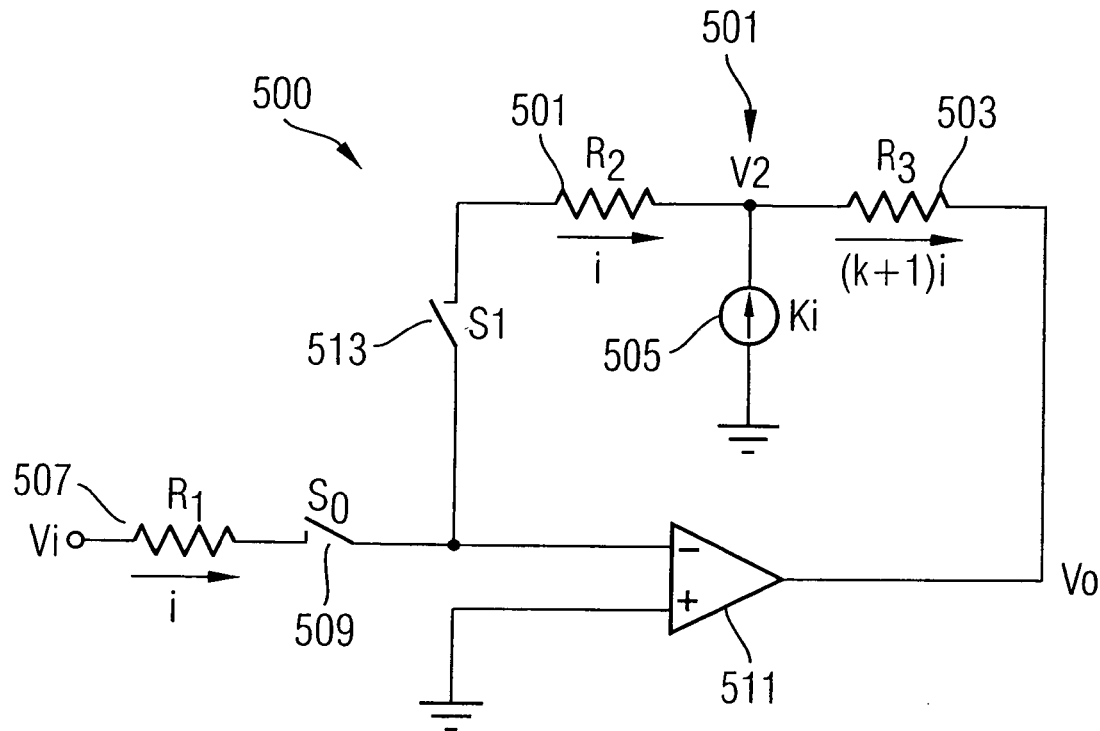
FIG. 5 provides a generalized diagram for the 1-T gain circuit of FIG. 1.
Figure 6:
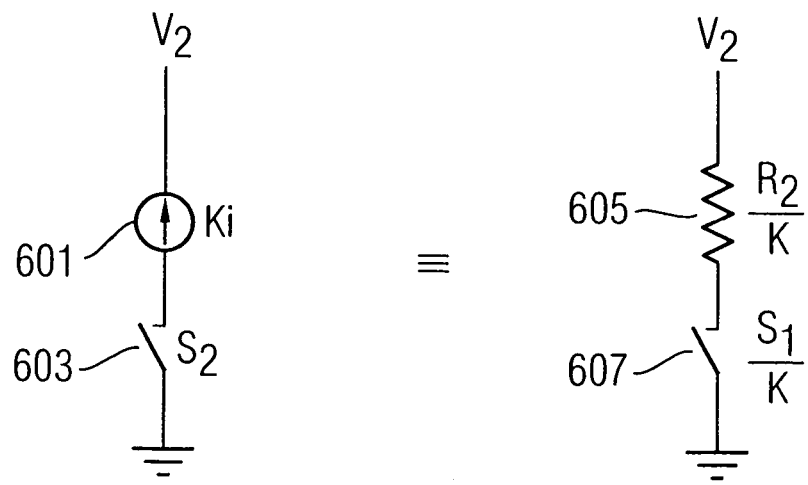
FIG. 6 shows the T resistor network of FIG. 5 as a current controlled current source representing a series connection of a resistor and switch. The figure also illustrates that the series connection of the resistor and switch is equivalent to the series connection of a current controlled current source and a switch.

FIG. 5 shows a generalized diagram for a 1-T (one T-structure) gain circuit 500 of the present invention. The circuit includes a T resistor network 501 comprising two resistors R2 501 and R3 503. For simplified analysis, the T resistor network 501 is shown with a current controlled current source 505 representing a series connection of a resistor 605 and switch 607 as illustrated in FIG. 6. The series connection of the resistor 605 and switch 607 is equivalent to the series connection of the current controlled current source Ki 601 and switch S2 603 also shown in FIG. 6. As in the circuit of FIG. 1, an input resistor R1 507 and an always-on switch S0 509 are electrically connected to the negative input of an amplifier 511. The switch S0 509 is inserted in the input branch to compensate for parasitic error of the switches of the feedback loop. For applications having multiplexed inputs this switch 509 is the input multiplexing switch. Also connected to the input branch is a switch S1 513.

The circuit 500 can be analysed as follows:

$$V_0 = V_2 - (k+1)iR_3$$
$$= -i(R_2 + R_{s1}) - (k+1)iR_3$$
$$= -i[R_2 + R_{s1} + (k+1)R_3]$$
$$= -\frac{V_i}{R_1 + R_{s0}}[R_2 + (k+1)R_3 + R_{s1}]$$

$$\text{Gain} = \frac{V_0}{V_i} = -\frac{R_2 + (k+1)R_3 + R_{s1}}{R_1 + R_{s0}}$$

for Gain = $\alpha$ $$\frac{R_2 + (k+1)R_3 + R_{s1}}{R_1 + R_{s0}} = \alpha$$

$$R_2 + (k+1)R_3 + R_{s1} = \alpha[R_1 + R_{s0}]$$

thus:

$$R_2 + (k+1)R_3 = \alpha R_1 \text{ and}$$

$$R_{s1} = \alpha R_{s0}$$

Thus, the parasitic effects of the switches are compensated by selecting the turn-on resistance of the switch S1 513 to have a value equal to the gain multiplied by the turn-on resistance of the switch S0 509. Also, the switch 607 is selected to have a turn-on resistance value equal to the turn-on resistance of the switch S1 513 scaled by the constant "k". In this way the parasitic switch impedance contributions are scaled so that they do not effect the values of the resistances that need to be selected to obtain a desired gain. Based on the above analysis of the circuit 500, table 1 shows that many different gain values can be obtained from the T resistor network 501 by varying the parameters.

TABLE 1

| Circuit | K | R2 501 | R3 503 | RS1 513 | Gain α |
|---------|---|--------|--------|---------|--------|
| 1  | 1 | R1   | R1   | 3 RS0  | 3  |
| 2  | 2 | R1   | R1   | 4 RS0  | 4  |
| 3  | 1 | 2 R1 | 2 R1 | 6 RS0  | 6  |
| 4  | 2 | 2 R1 | 2 R1 | 8 RS0  | 8  |
| 5  | 3 | 2 R1 | 2 R1 | 10 RS0 | 10 |
| 6  | 4 | 2 R1 | 2 R1 | 12 RS0 | 12 |
| 7  | 5 | 2 R1 | 2 R1 | 14 RS0 | 14 |
| 8  | 6 | 2 R1 | 2 R1 | 16 RS0 | 16 |
| 9  | 1 | R1   | 3 R1 | 7 RS0  | 7  |
| 10 | 2 | R1   | 3 R1 | 10 RS0 | 10 |
| 11 | 3 | R1   | 3 R1 | 13 RS0 | 13 |
| 12 | 4 | R1   | 3 R1 | 16 RS0 | 16 |

Figure 7:
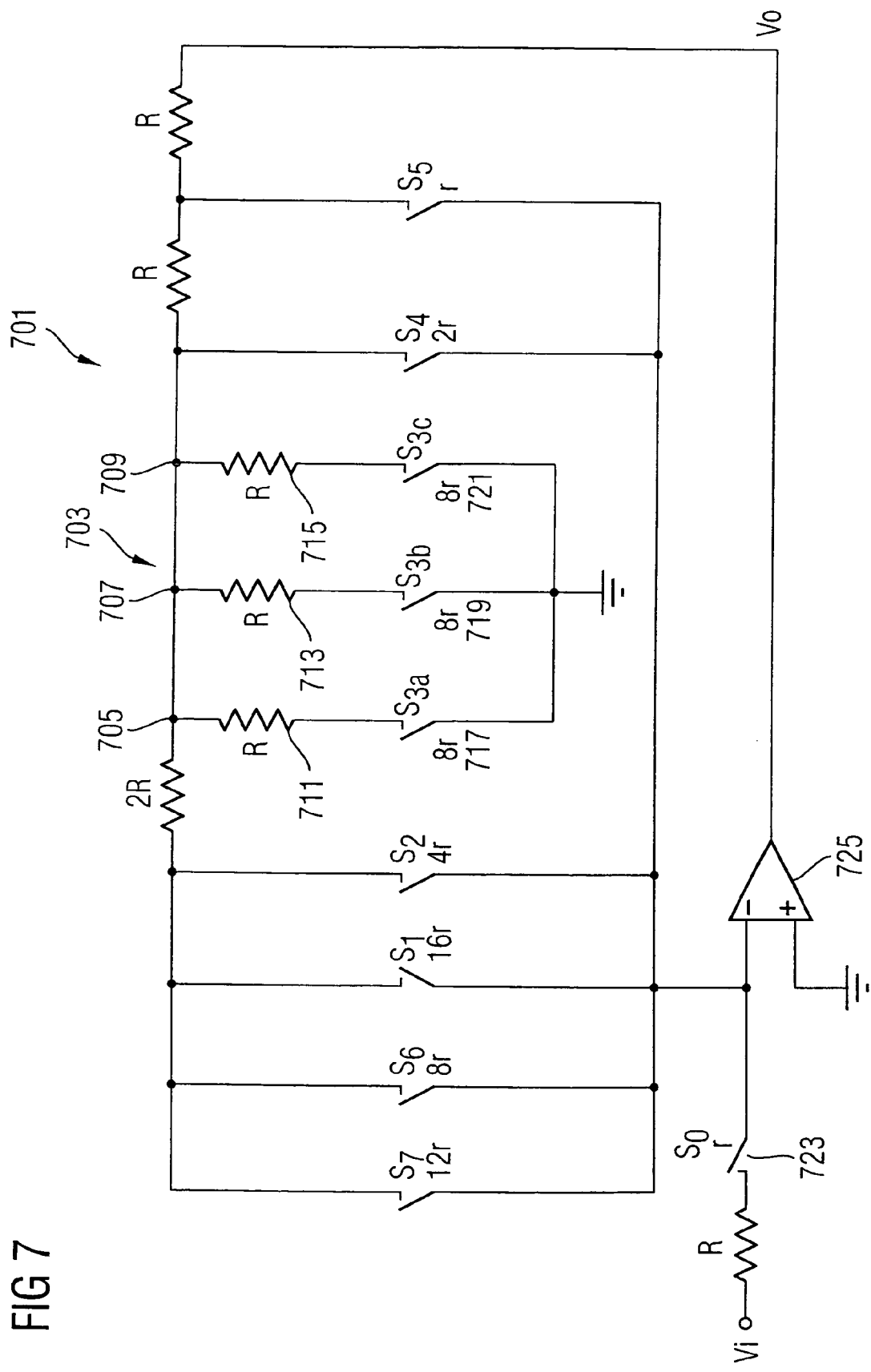
FIG. 7 is a schematic diagram of a distributed-T circuit embodiment of the present invention

FIG. 7 illustrates a distributed-T circuit 701 embodiment of the present invention. The branch of the T-network 501 made up of the single resistor 605 and the single switch 607 is replaced by a distributed branch made up of three branches 705, 707, 709 each including a resistor R 711, 713, 715 and a switch S3a 717, S3b 719, S3c 721. Although the distributed branch in this embodiment is made up of three branches, it can be made up of more branches or fewer branches. Also included are switches S0 723, S1, S4, S5, S6 and S7. The switch S0 723 at the negative input of an amplifier 725 is usually closed (on) when selecting the circuit 701. By opening and closing the switches S1, S2, S3a, S3b, S3c, S4, S5, S6 and S7 many different gain values can be obtained from the T resistor network 701. Some examples of the possible combinations are shown in Table 2. The table lists the gains that are obtained when the listed switches are closed (on). For each specified gain, the switches not listed are open (off).

TABLE 2

| Gain | Closed (on) Switches - Other switches are Open (off) |
|------|------------------------------------------------------|
| 1  | S5 |
| 2  | S4 |
| 4  | S2 |
| 8  | S3a, S6 |
| 12 | S3a, S3b, S7 |
| 16 | S3a, S3b, S3c, S1 |

Figure 8:
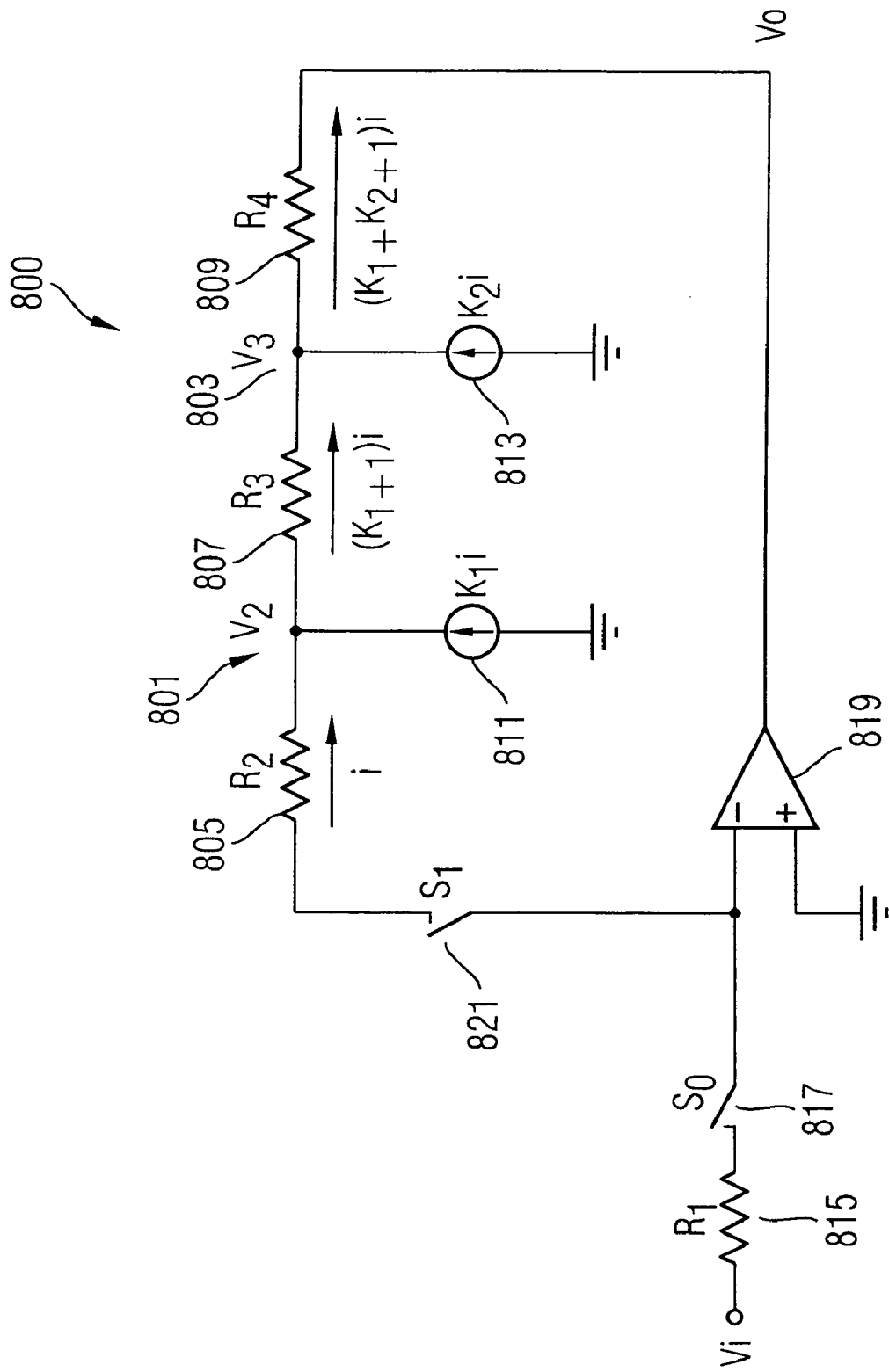
FIG. 8 shows a 2-T (two separate T-structures) gain circuit of the present invention.

FIG. 8 shows a 2-T (two separate T-structures) gain circuit 800 of the present invention. This embodiment shows how the 1-T (one T-structure) gain circuit 500 of FIG. 5 can be extended to an arbitrary number of additional T-structures. The circuit includes two separate T resistor networks 801, 803. The network 801 comprises two resistors R2 805 and R3 807. The network 803 also comprises two resistors R3 807 and R4 809, sharing R3 807 with the network 801. For simplified analysis, the T resistor networks 801, 803 are shown with current controlled current sources 811, 813, respectively, each representing the series connection of a resistor 605 and switch 607 as illustrated in FIG. 6. Again, the series connection of the resistor 605 and switch 607 is equivalent to the series connection of the current controlled current source Ki 601 and switch S2 603 also shown in FIG. 6. As in the circuit of FIG. 1, an input resistor R1 815 and an always-on switch S0 817 are electrically connected to the negative input of an amplifier 719 Also connected to the input branch is a switch S1 821.

The circuit 800 can be analysed as follows:

$$V_0 = V_3 - (k_1 + k_2 + 1)iR_4$$
$$V_3 = V_2 - (k_1 + 1)iR_3$$
$$V_2 = -i(R_2 + R_{S1})$$
$$V_0 = -i(R_2 + R_{S1}) - (k_1 + 1)iR_3 - (k_1 + k_2 + 1)iR_4$$
$$= -i[(R_2 + (k_1 + 1)R_3 + (k_1 + k_2 + 1)R_4 + R_{S1}]$$

$$\text{Gain} = \alpha = \frac{V_0}{V_i} = -\frac{R_2 + (k_1 + 1)R_3 + (k_1 + k_2 + 1)R_4 + R_{S1}}{R_1 + R_{S0}}$$

thus:

$$R_2 + (k_1 + 1)R_3 + (k_1 + k_2 + 1)R_4 = \alpha R_1 \text{ and}$$

$$R_{S1} = \alpha R_{S0}$$

Thus, the parasitic effects of the switches are compensated by selecting the turn-on resistance of the switch S1 821 to have a value equal to the gain multiplied by the turn-on resistance of the switch S0 817. Also, the switch 607 is selected to have a turn-on resistance value equal to the turn-on resistance of the switch S1 821 scaled by the constant "k". In this way the parasitic switch impedance contributions are scaled so that they do not effect the values of the resistances that need to be selected to obtain a desired gain Based on the above analysis of the circuit 800, table 3 shows that many different gain values can be obtained from the 2-T gain circuit 800 by varying the parameters.

TABLE 3

| Circuit | K1 | K2 | R2 805 | R3 807 | R4 809 | RS1 821 | Gain α |
|---|---|---|---|---|---|---|---|
| 1 | 1 | 1 | R1 | R1 | 2R1 | 9 RS0 | 9 |
| 2 | 1 | 2 | R1 | R1 | 2R1 | 11 RS0 | 11 |
| 3 | 2 | 1 | R1 | R1 | 2R1 | 12 RS0 | 12 |
| 4 | 1 | 3 | R1 | R1 | 2R1 | 13 RS0 | 13 |
| 5 | 2 | 2 | R1 | R1 | 2R1 | 14 RS0 | 14 |
| 6 | 2 | 3 | R1 | R1 | 2R1 | 16 RS0 | 16 |

Figure 9:
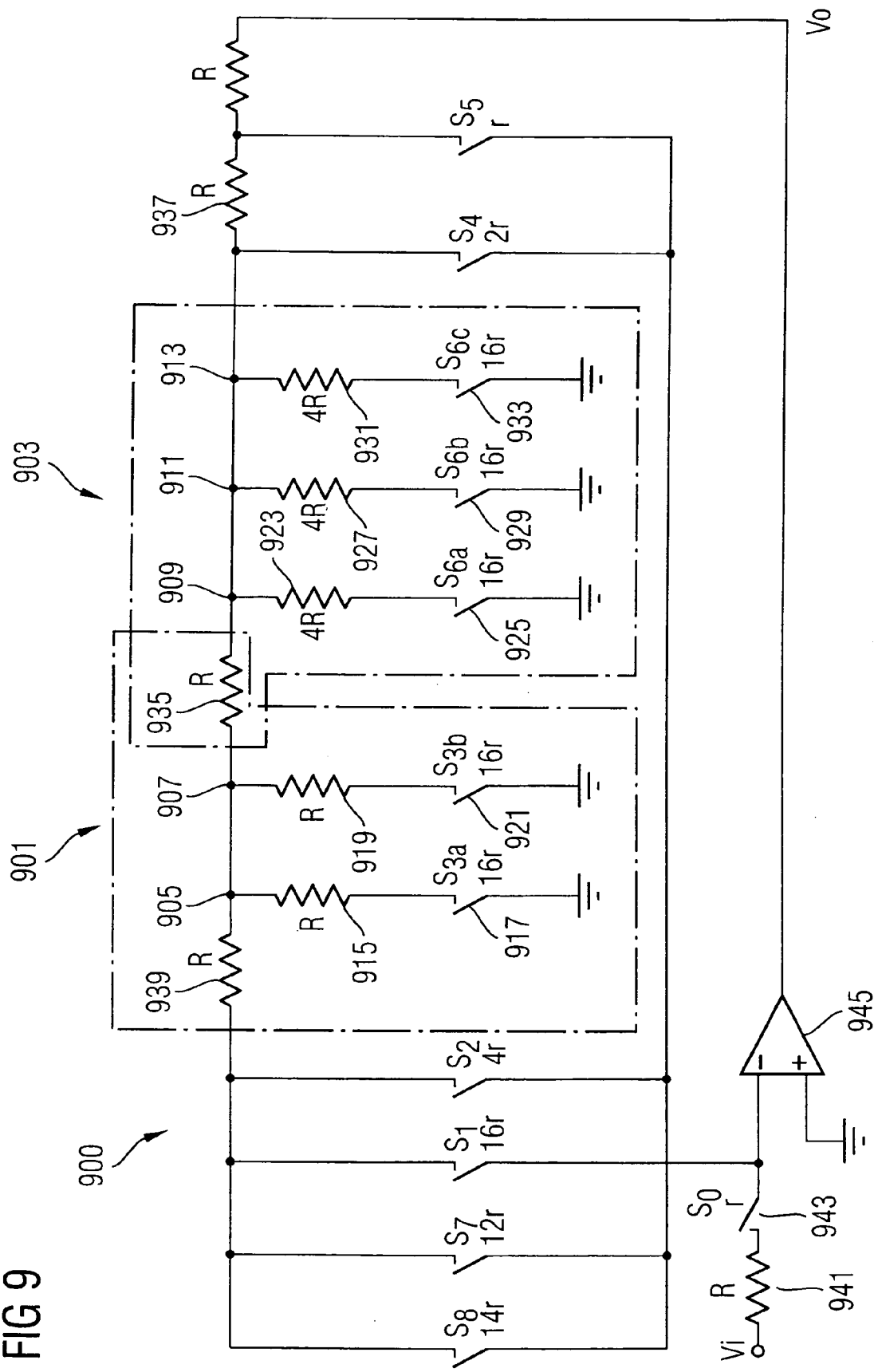
FIG. 9 illustrates a combination 2-T/distributed-T gain circuit of the present invention.

FIG. 9 illustrates a combination 2-T/distributed-T gain circuit 900. The circuit 900 includes two separate T-structures 901, 903.

The T-structure 901 includes a resistor 937 having a resistance of R, a resistor 935 also having a resistance of R, and the distributed branches 905, 907 The distributed branch 905 includes a resistor 915 having a resistance of R and a switch S3a 917 having a turn-on resistance of 16r. The distributed branch 907 includes a resistor 919 having a resistance of R and a switch S3b 921 having a turn-on resistance of 16r.

The T-structure 903 includes a resistor 939 having a resistance of R, the resistor 935 which is also shared with the T-structure 901, and the distributed branches 909, 911, 913. The distributed branch 909 includes a resistor 923 having a resistance of 4R and a switch S6a 925 having a turn-on resistance of 16r. The distributed branch 911 includes a resistor 927 having a resistance of 4R and a switch S6b 929 having a turn-on resistance of 16r. The distributed branch 913 includes a resistor 931 having a resistance of 4R and a switch S6c 933 having a turn-on resistance of 16r.

As in the circuit of FIG. 1, an input resistor 941 having a resistance R and an always-on switch S0 943 are electrically connected to the negative input of an amplifier 945. Again, the always-on switch S0 943 S0 is inserted in the input branch to compensate for the parasitic error caused by the turn on resistances of the switches in the feed-back loop. The switches in the feed-back loop are scaled relative to the switch S0. Switches S1, S2, S4, S5, S7 and S8 have turn-on resistances 16r, 4r, 2r, r, 12r and 14r, respectively.

Table 4 provides examples of various gains that can be obtained from the combination 2-T/distributed-T gain circuit 900 by opening and closing the different switches. Note that other resistor and switch values can be used as well as structures having more T-structures. Additionally, each of the T-structures can have a single branch or can be distributed -T structures having two or more distributed branches.

TABLE 4

| Gain | Closed (on) Switches - Other switches are Open (off) |
|---|---|
| 1 | S5 |
| 2 | S4 |
| 4 | S2 |
| 12 | S3a, S3b, S6a, S7 |
| 14 | S3a, S3b, S6a, S6b, S8 |
| 16 | S3a, S3b, S6a, S6b, S6c, S1 |

Figure 10:
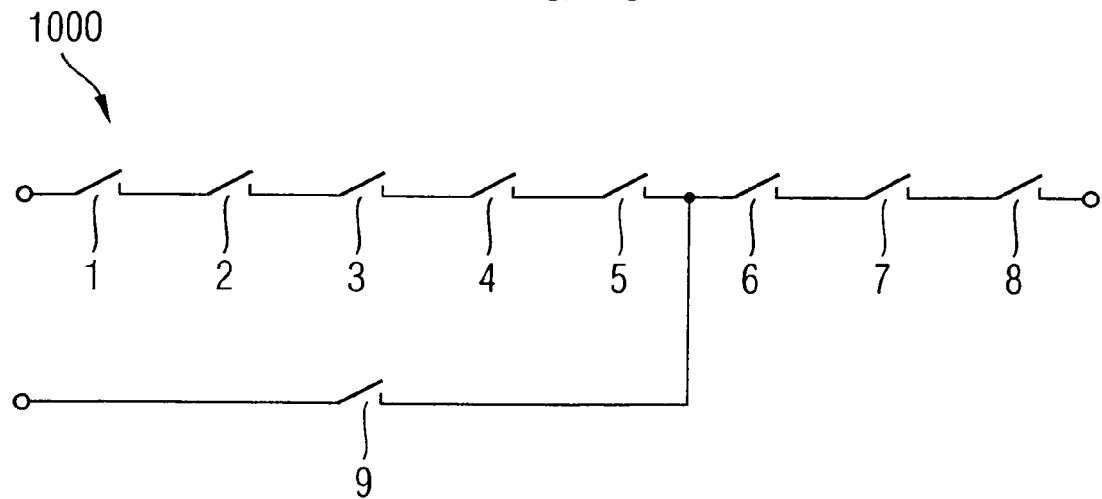
FIG. 10 shows a switch structure for reducing the total number of switches used by reusing switches in the gain circuits.

FIG. 10 illustrates a switch structure 1000 for reducing the total number of switches used by reusing switches in the gain circuits. For example, the single 9-switch structure 1000 can be used to implement both a switch S1 having a turn-on resistance of 8r and a switch S2 having a turn-on resistance of 4r. The switch S2 can be implemented by turning on (closing) the switches 1–8 with the switch 9 open. The switch S2 can be implemented by turning off (opening) switches 1–5 while turning on (closing) the switches 6–9.

The general embodiment for reusing switches is explained with reference to FIG. 11. The single switch S0 can be switched between N1+N2 switches in series. There are N1+1 switches preceding and N2–1 switches following the switch S0 connection. Thus the maximum value of the turn-on resistance of the switching combination is N1+N2 and the minimum value is N2.

Figure 12:
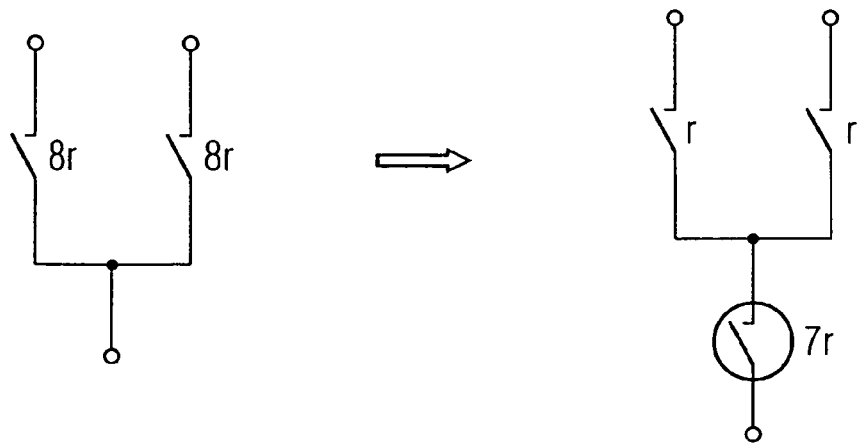
FIG. 12 shows reusing switches by sharing a switch having a turn-on resistance of 7r between two branches to form 8r branches.

FIG. 12 shows reusing switches by sharing a switch having a turn-on resistance of 7r between two branches to form 8r branches. Thus only 9 switches are needed rather than 16.

Figure 11:
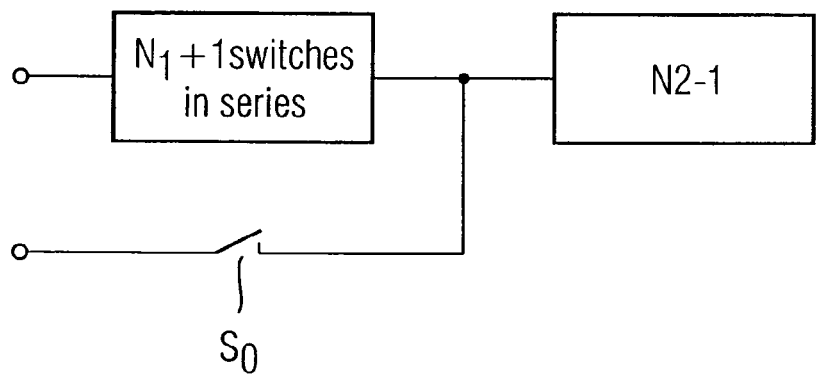
FIG. 11 shows a general layout for reusing switches.
Figure 13:
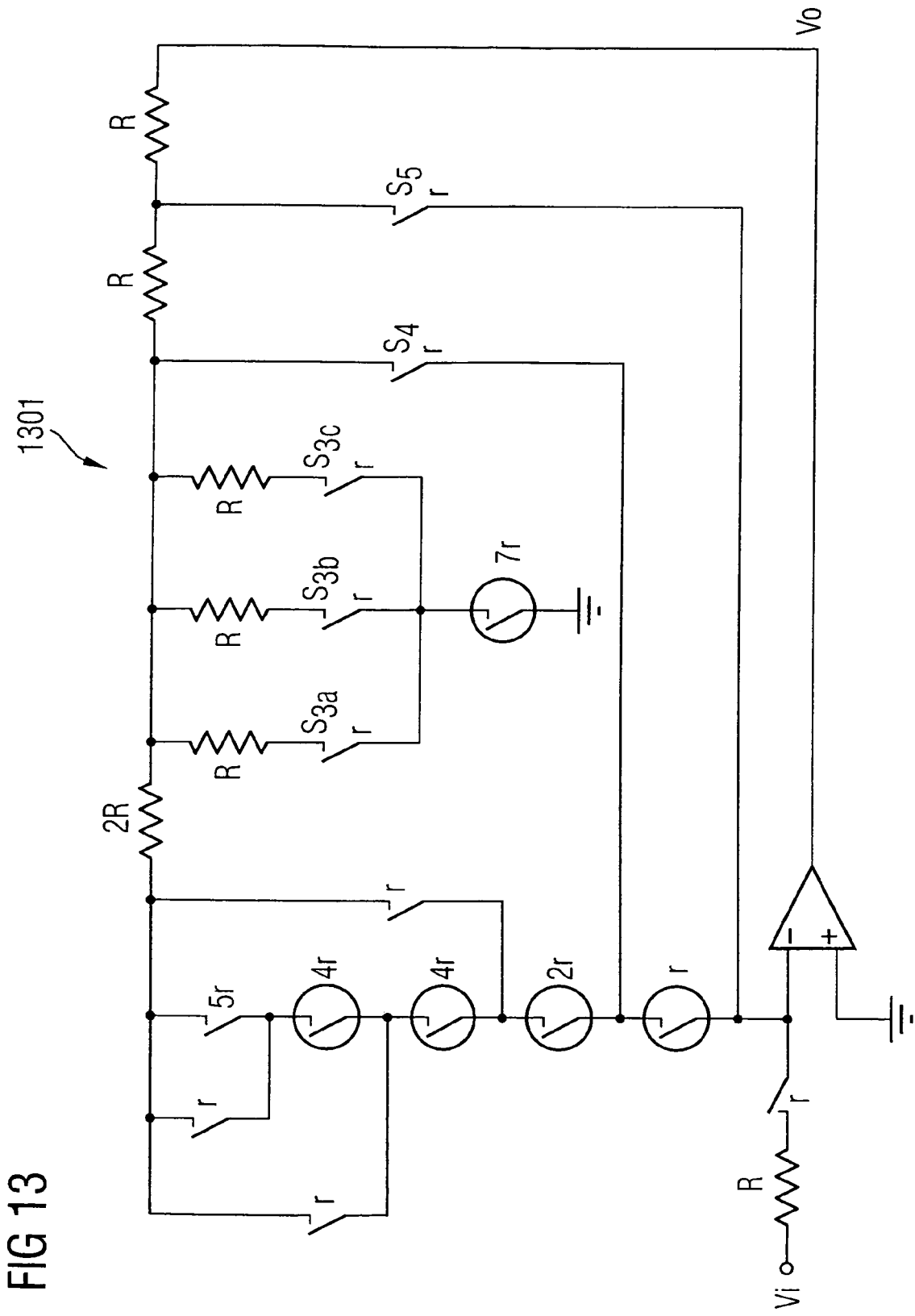
FIGS. 13 and 14 show the use of the switch reuse configurations of FIGS. 11 and 12 with the circuits of FIGS. 7 and 9, respectively.
Figure 14:
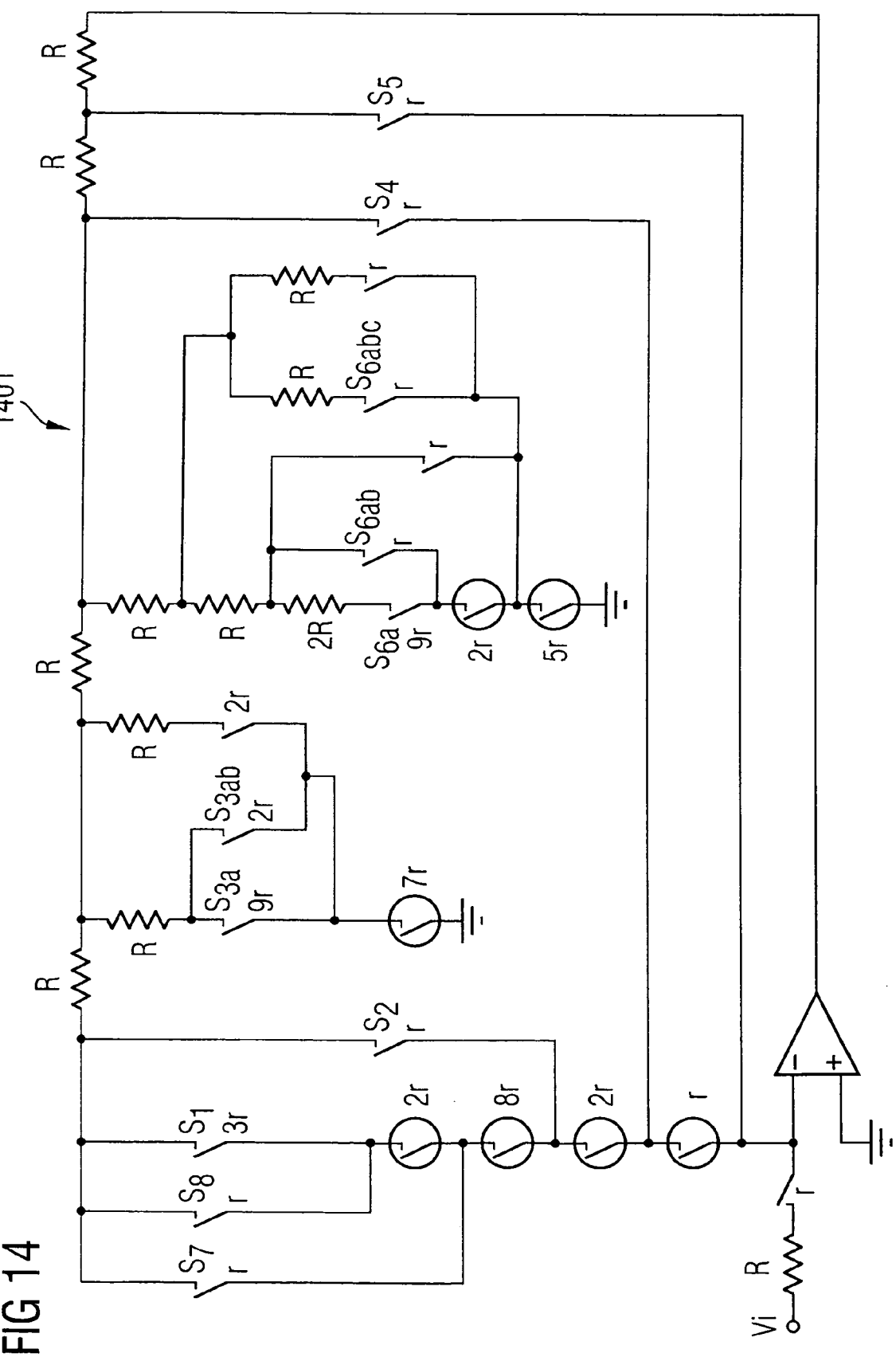

FIGS. 13 (circuit 1301) and 14 (circuit 1401) illustrate the use of the switch reuse configurations of FIGS. 11 and 12 with the circuits of FIGS. 7 and 9, respectively. Thus, the present invention provides resistor and switch-minimized variable analog gain circuits.

What is claimed is:

1. A variable analog gain circuit comprising:
   a differential amplifier;
   a negative feedback loop; and
   a first T resistor network comprised of first, second and third resistor branches joined at a junction point;
   wherein the first and second resistor branches are connected in series with the negative feedback loop;
   wherein the third branch includes a switch that connects the junction point through the third resistor branch to ground when in a closed state and that turns the third resistor branch into an open circuit when in an open state;
   wherein the switch of the third resistor branch, when in the closed state, produces a gain at the output of the variable analog gain circuit; and
   wherein the first T resistor network is comprised of low resistance poly resistors and switches.

2. The circuit of claim 1, wherein the first T resistor network is a distributed T resistor network such that the third resistor branch is a distributed branch comprising at least two sub branches each including a resistor and a switch that connects the junction point through one of the sub branches to ground when in a closed state and that turns the sub branch into an open circuit when in an open state; and wherein the switches are opened and closed in different combinations to vary the gain produced by the variable analog gain circuit between more than two different gains.

3. The circuit of claim 1, further comprising a second T resistor network connected in series to the first T resistor network and comprised of first, second and third resistor branches joined at a junction point; and wherein values of the resistors are selected to produce circuits having desired gain values.

4. The circuit of claim 1, wherein switches are re-used in different combinations to vary the gain produced by the variable analog gain circuit.

* * * * *

UNITED STATES PATENT AND TRADEMARK OFFICE
CERTIFICATE OF CORRECTION

PATENT NO. : 7,057,454 B2  
APPLICATION NO. : 10/855861  
DATED : June 6, 2006  
INVENTOR(S) : Fan Yung Ma et al.

It is certified that error appears in the above-identified patent and that said Letters Patent is hereby corrected as shown below:

Title page, item [75] inventor's name should read --Fan Yung Ma, Singapore (SG)--.

Signed and Sealed this

Thirty-first Day of October, 2006

JON W. DUDAS  
*Director of the United States Patent and Trademark Office*